United States Patent
Kang et al.

(10) Patent No.: US 11,270,938 B2
(45) Date of Patent: Mar. 8, 2022

(54) SEMICONDUCTOR DEVICES AND METHODS OF FORMING SEMICONDUCTOR DEVICES

(71) Applicant: GLOBALFOUNDRIES Singapore Pte. Ltd., Singapore (SG)

(72) Inventors: Kai Kang, Singapore (SG); Yi Jiang, Singapore (SG); Curtis Chun-I Hsieh, Singapore (SG); Wanbing Yi, Singapore (SG); Juan Boon Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/910,100

(22) Filed: Jun. 24, 2020

(65) Prior Publication Data
US 2021/0407906 A1 Dec. 30, 2021

(51) Int. Cl.
| | | |
|---|---|---|
| *H01L 23/522* | (2006.01) | |
| *H01L 21/283* | (2006.01) | |
| *H01L 49/02* | (2006.01) | |
| *H01L 45/00* | (2006.01) | |
| *G11C 5/06* | (2006.01) | |
| *H01L 43/12* | (2006.01) | |
| H01L 27/22 | (2006.01) | |
| H01L 27/24 | (2006.01) | |

(52) U.S. Cl.
CPC ............ *H01L 23/5228* (2013.01); *G11C 5/06* (2013.01); *H01L 21/283* (2013.01); *H01L 23/5226* (2013.01); *H01L 28/20* (2013.01); *H01L 43/12* (2013.01); *H01L 45/16* (2013.01); H01L 27/222 (2013.01); H01L 27/24 (2013.01)

(58) Field of Classification Search
CPC . H01L 23/5228; H01L 23/5226; H01L 28/20; H01L 27/222; H01L 27/24; H01L 43/12; G11C 5/06
See application file for complete search history.

(56) References Cited

U.S. PATENT DOCUMENTS

| | | |
|---|---|---|
| 8,212,649 B2 | 7/2012 | Fujiwara et al. |
| 2007/0046421 A1 | 3/2007 | Gogineni et al. |
| 2017/0104029 A1* | 4/2017 | Li .......................... G11C 11/161 |

* cited by examiner

*Primary Examiner* — Joseph C. Nicely
(74) *Attorney, Agent, or Firm* — Viering Jentschura & Partner MBB

(57) ABSTRACT

A semiconductor device may be provided, including a base layer, an insulating layer arranged over the base layer, a memory structure arranged at least partially within the insulating layer, where the memory structure may include a first electrode, a second electrode, and an intermediate element between the first electrode and the second electrode, and a resistor arranged at least partially within the insulating layer, where the resistor may be arranged in substantially a same horizontal plane with one of the first electrode and the second electrode.

18 Claims, 8 Drawing Sheets

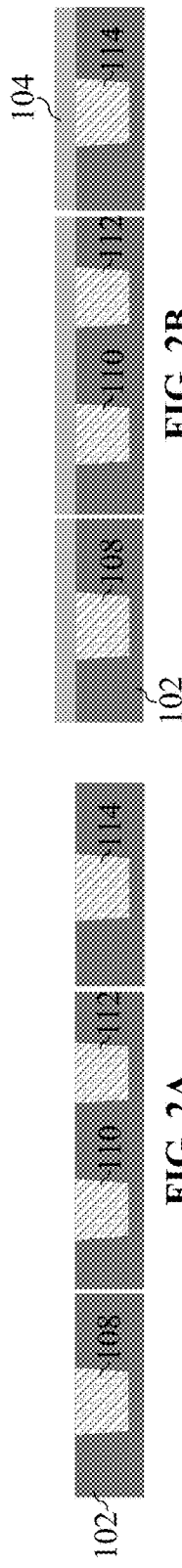
FIG. 2A
FIG. 2B
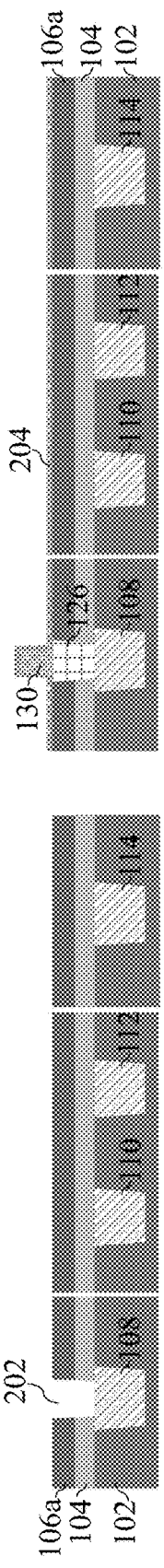
FIG. 2C
FIG. 2D
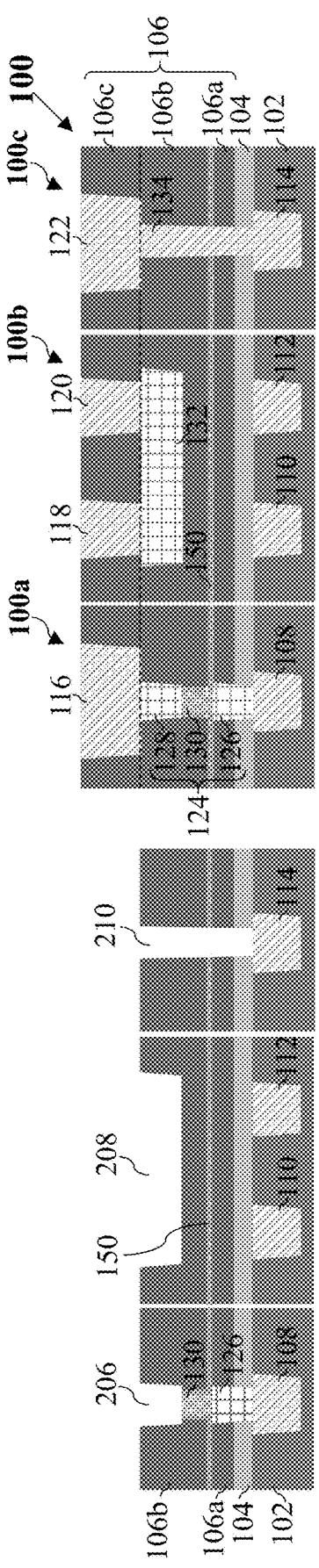
FIG. 2E
FIG. 2F

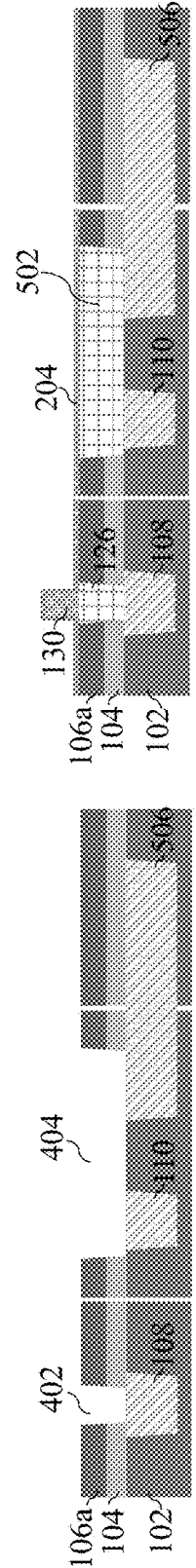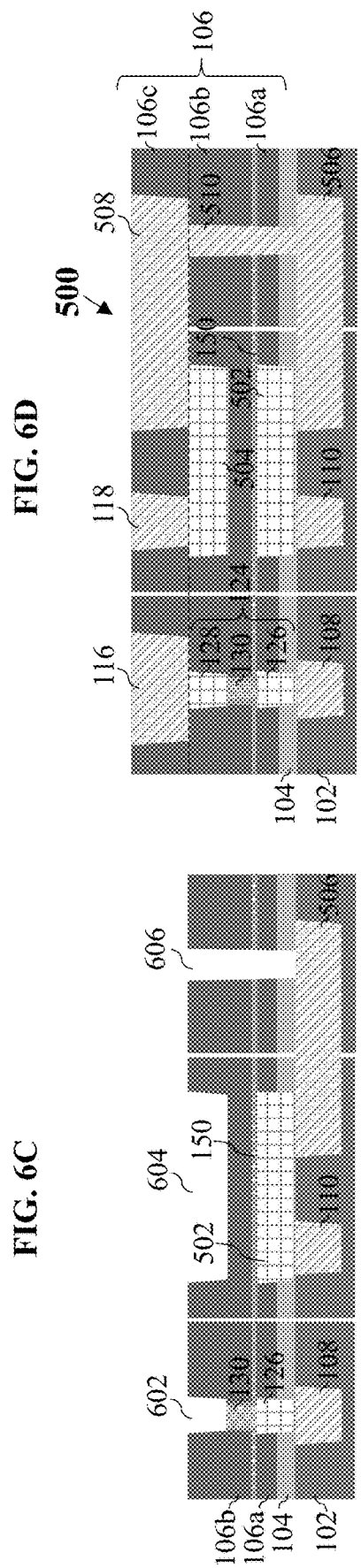
FIG. 6A FIG. 6B
FIG. 6C FIG. 6D
FIG. 6E FIG. 6F

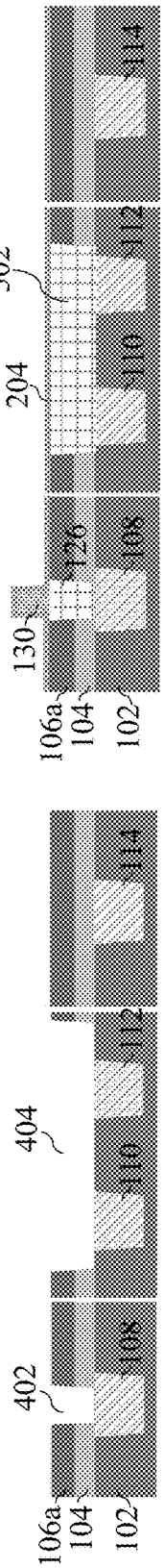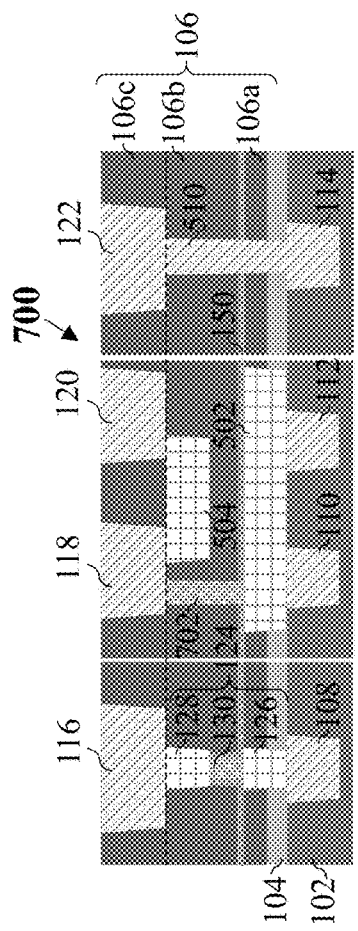
FIG. 8A  FIG. 8B  FIG. 8C  FIG. 8D  FIG. 8E  FIG. 8F

US 11,270,938 B2

SEMICONDUCTOR DEVICES AND METHODS OF FORMING SEMICONDUCTOR DEVICES

TECHNICAL FIELD

The present disclosure relates generally to semiconductor devices, and methods of forming the semiconductor devices.

BACKGROUND

Resistors are often used to implement certain functions of semiconductor devices and to improve the performance of these devices. For example, resistors may be used in back-end-of-line (BEOL) technology to achieve a more balanced resistor-capacitor (RC) load. By forming the resistors in the back end, the parasitic capacitive coupling between the resistors and the semiconductor substrate may be lower as compared to forming the resistors in the front end.

However, current processes to include resistors within semiconductor devices are often complex. For instance, some processes may include the use of several masks and multiple etching processes. This may affect the throughput of the manufacturing processes and the costs of fabricating the semiconductor devices.

Accordingly, it is desirable to provide an improved semiconductor device including a resistor, where the semiconductor device can be manufactured with a simpler process.

SUMMARY

According to various non-limiting embodiments, there may be provided a semiconductor device including: a base layer; an insulating layer arranged over the base layer; a memory structure arranged at least partially within the insulating layer, where the memory structure may include a first electrode, a second electrode, and an intermediate element between the first electrode and the second electrode; and a resistor arranged at least partially within the insulating layer, where the resistor may be arranged in substantially a same horizontal plane with one of the first electrode and the second electrode.

According to various non-limiting embodiments, there may be provided a method for fabricating a semiconductor device. The method may include providing a base layer; forming an insulating layer over the base layer; forming a memory structure at least partially within the insulating layer, where the memory structure may include a first electrode, a second electrode and an intermediate element between the first electrode and the second electrode; and forming a resistor at least partially within the insulating layer, where the resistor is arranged in substantially a same horizontal plane with one of the first electrode and the second electrode.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Non-limiting embodiments of the invention will now be illustrated for the sake of example only with reference to the following drawings, in which:

FIGS. 2A to 2F show simplified cross-sectional views that illustrate a method for fabricating the semiconductor device of FIG. 1 according to various non-limiting embodiments;

FIGS. 6A to 6F show simplified cross-sectional views that illustrate a method for fabricating the semiconductor device of FIG. 5 according to various non-limiting embodiments;

FIGS. 8A to 8F show simplified cross-sectional views that illustrate a method for fabricating the semiconductor device of FIG. 7 according to various non-limiting embodiments.

DETAILED DESCRIPTION

Figure 1:
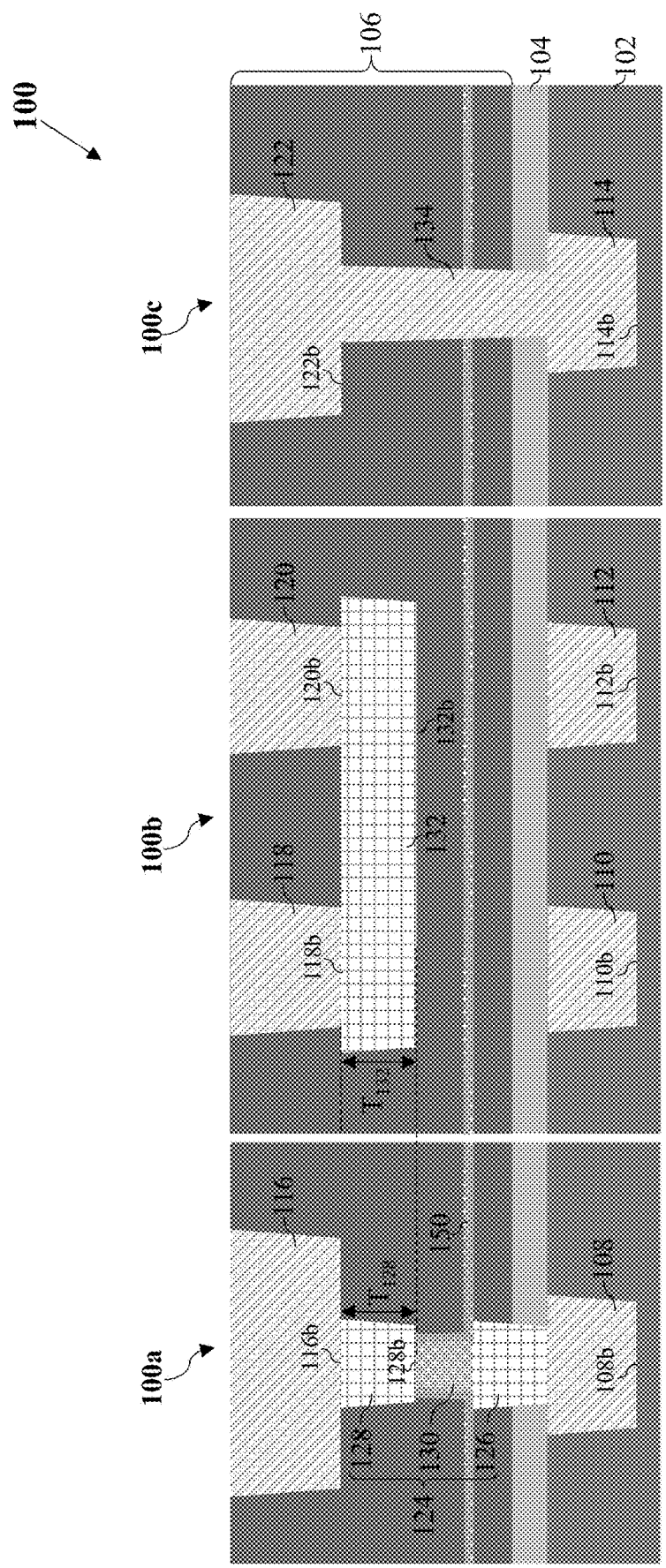
FIG. 1 shows a simplified cross-sectional view of a semiconductor device according to various non-limiting embodiments.

The embodiments generally relate to semiconductor devices. More particularly, some embodiments relate to semiconductor devices having a memory area with an embedded memory structure and a logic area with a resistor. The semiconductor devices may be used in several applications, such as, but not limited to, multimedia and communication applications.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "approximately", "about," is not limited to the precise value specified. In some instances, the approximating language may correspond to the precision of an instrument for measuring the value or the normal tolerances of the semiconductor industry. Further, a direction or alignment is modified by a term or terms, such as "substantially" to mean that the direction or alignment is to be applied within normal tolerances of the semiconductor industry. For example, "substantially parallel" means largely extending in the same direction within normal tolerances of the semiconductor industry and "substantially perpendicular" means at an angle of ninety degrees plus or minus a normal tolerance of the semiconductor industry. For example, by "a first element arranged in substantially a same horizontal/vertical plane with a second element", it is meant that at least 60% (in other words, 60% to 100%, alternatively 80% to 100%) of the first element may overlap laterally/vertically with the second element. For example, when the first and second elements are arranged in substantially a same horizontal plane, at least a part of a bottom surface of the first element may be substantially horizontally aligned with at least a part of a bottom surface of the second element, and/or at least a part of a top surface of the first element may be substantially horizontally aligned with at least a part of a top surface of the second element, and/or a horizontal middle plane through the first element may be substantially horizontally aligned with a horizontal middle plane through the second element. For example, when the first and second elements are arranged in substantially a same vertical plane, a vertical middle plane through the first element may be substantially vertically aligned with a vertical middle plane through the second element. In this document, "substantially horizontally/vertically aligned" means largely (e.g. 60% to 100% of each specified surface/plane) overlapping with a same horizontal/vertical plane.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the term "connected," when used to refer to two physical elements, means a direct connection between the two physical elements. The term "coupled," however, can mean a direct connection or a connection through one or more intermediary elements.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

FIG. 1 shows a simplified cross-sectional view of a semiconductor device 100 according to various non-limiting embodiments. The semiconductor device 100 may be a part of a BEOL stack within a chip.

As shown in FIG. 1, the semiconductor device 100 may include a base layer 102, a blocking layer 104 arranged over the base layer 102 and an insulating layer 106 arranged over the base layer 102, in particular, the blocking layer 104. The base layer 102 may be an inter-layer dielectric (ILD) layer and may include insulating material, such as, but not limited to, silicon oxide, silicon dioxide, silicon nitride, or combinations thereof. The insulating layer 106 may similarly be an inter-layer dielectric (ILD) layer and may also include insulating material, such as, but not limited to, silicon oxide, silicon dioxide, silicon nitride or combinations thereof. The blocking layer 104 may be a metal diffusion blocking layer or a metal insulating layer, and may include blocking material, such as, but not limited to, Nblok (nitrogen-doped silicon carbide), silicon nitride, or combinations thereof.

As shown in FIG. 1, the semiconductor device 100 may include a memory area 100a, a logic area 100b and a further logic area 100c. The areas 100a, 100b, 100c are depicted in FIG. 1 with gaps between them to more clearly differentiate them, but these areas 100a, 100b, 100c may share a continuous base layer 102, a continuous blocking layer 104 and a continuous insulating layer 106.

The semiconductor device 100 may include first contacts (including a first memory contact 108, a first logic contact 110, an additional first logic contact 112 and a first further logic contact 114) arranged at least partially within the base layer 102. The first memory contact 108 may be arranged within the memory area 100a, the first logic contacts 110, 112 may be arranged within the logic area 100b and the first further logic contact 114 may be arranged within the further logic area 100c. The first contacts 108, 110, 112, 114 may be arranged in substantially a same horizontal plane. In particular, the first contacts 108, 110, 112, 114 may have a same thickness and may each include a bottom surface 108b, 110b, 112b, 114b respectively, where these bottom surfaces 108b, 110b, 112b, 114b may be substantially horizontally aligned. Further, the first contacts 108, 110, 112, 114 may be spaced apart from one another, or in other words, a part of the base layer 102 may be arranged between each pair of adjacent first contacts 108, 110, 112, 114. The first contacts 108, 110, 112, 114 may include conductive material, such as, but not limited to, aluminum, copper, tungsten, alloys thereof or combinations thereof. Although the first contacts 108, 110, 112, 114 are shown in FIG. 1 as being entirely arranged within the base layer 102, one or more of these first contacts 108, 110, 112, 114 may instead partially extend outside of the base layer 102.

The semiconductor device 100 may further include second contacts (a second memory contact 116, a second logic contact 118, an additional second logic contact 120 and a second further logic contact 122) arranged at least partially within the insulating layer 106. The second memory contact 116 may be arranged within the memory area 100a, the second logic contacts 118, 120 may be arranged within the logic area 100b, and the second further logic contact 122 may be arranged within the further logic area 100c. The second contacts 116, 118, 120, 122 may be arranged in substantially a same horizontal plane. In particular, the second contacts 116, 118, 120, 122 may have a same thickness and may each include a bottom surface 116b, 118b, 120b, 122b respectively, where these bottom surfaces 116b, 118b, 120b, 122b may be substantially horizontally aligned. The second contacts 116, 118, 120, 122 may include conductive material, such as, but not limited to, aluminum, copper, tungsten, alloys thereof or combinations thereof. Although the second contacts 116, 118, 120, 122 are shown in FIG. 1 as being entirely arranged within the insulating layer 106, one or more of these second contacts 116, 118, 120, 122 may instead partially extend outside of the insulating layer 106.

The semiconductor device 100 may further include a memory structure 124 arranged at least partially within the insulating layer 106, in particular, within the memory area 100a. The memory structure 124 may include a first electrode 126, a second electrode 128 and an intermediate element 130 between the first electrode 126 and the second electrode 128. The intermediate element 130 may include any kind of memory material depending on the memory type the structure 124 may be. In some non-limiting embodiments, the intermediate element 130 may be a memory pillar having multiple layers formed of different materials. To protect the intermediate element 130 from damages, a protective layer 150 may be provided, where the protective layer 150 may extend along sides of the intermediate element 130 and across the insulating layer 106. The protective layer 150 may include protective material, such as, but not limited to nitride. For example, the protective layer 150 may be an encapsulated nitride layer. The memory structure 124 may be arranged (embedded) between the first memory contact 108 and the second memory contact 116. In particular, the first electrode 126 may be arranged over the first memory contact 108 and may adjoin the first memory contact 108; whereas, the second electrode 128 may be arranged under the second memory contact 116 and may adjoin the second memory contact 116. The intermediate element 130 may be arranged over the first electrode 126 and under the second electrode 128. In FIG. 1, the memory structure 124 is depicted as partially within the insulating layer 106 with the first electrode 126 extending out of the insulating layer 106 through the blocking layer 104 to adjoin the first memory contact 108. Alternatively, the blocking layer 104 may be omitted and the memory structure 124 may be completely arranged within the insulating layer 106.

The memory structure 124 may be any memory structure as known to one skilled in the art, such as, but not limited to, a resistive random access memory (RRAM) structure or a magnetoresistive random access memory (MRAM) structure.

In a non-limiting embodiment, the memory structure 124 may be a RRAM structure. In this non-limiting embodiment, the first electrode 126 may be an inert electrode including inert electrode material, such as, but not limited to ruthenium (Ru), platinum (Pt), titanium nitride (TiN), tantalum nitride (TaN), alloys thereof, or combinations thereof. The second electrode 128 may be an active electrode including active electrode material such as, but not limited to, tantalum (Ta), tantalum nitride (TaN), hafnium (Hf), titanium (Ti), titanium nitride (TiN), platinum (Pt), copper (Cu), silver (Ag), cobalt (Co), tungsten (W), alloys thereof, or combinations thereof. The intermediate element 130 may be a switching element including switching material, such as, but not limited to, magnesium oxide (MgO), tantalum oxide (TaO2), hafnium oxide (HfO2), titanium oxide (TiO2), aluminum oxide (AlO2), silicon dioxide (SiO2), or combinations thereof. Further, the blocking layer 104 may include Nblok or silicon nitride.

In an alternative non-limiting embodiment, the memory structure 124 may be a MRAM structure. In this non-limiting embodiment, the first electrode 126 may be a ferromagnetic fixed layer (with magnetization fixed in a particular direction) and the second electrode 128 may be a ferromagnetic free layer (with magnetization free to rotate). The intermediate element 130 may be a magnetic tunnel junction. The first and second electrodes 126, 128 may include ferromagnetic material, such as, but not limited to, cobalt (Co), cobalt iron (CoFe), cobalt iron boron (CoFeB), iron nickel (NiFe), ruthenium (Ru), alloys thereof, or combinations thereof. The intermediate element 130 may be a thin oxide barrier including oxide such as, but not limited to, magnesium oxide (MgO), aluminum oxide ($Al_2O_3$), or combinations thereof. Further, the blocking layer 104 may include low temperature silicon nitride.

Referring to FIG. 1, the semiconductor device 100 may further include a resistor 132 arranged at least partially within the insulating layer 106, in particular, within the logic area 100b. The resistor 132 may be a thin film resistor. As shown in FIG. 1, the resistor 132 may be planar, and a thickness $T_{132}$ of the resistor 132 may be approximately equal to a thickness $T_{128}$ of the second electrode 128. Further, the resistor 132 may be arranged in substantially a same horizontal plane with the second electrode 128, with a bottom surface 132b of the resistor 132 substantially horizontally aligned with a bottom surface 128b of the second electrode 128. In addition, the resistor 132 may be arranged under the second logic contacts 118, 112 and may adjoin the second logic contacts 118, 120. The resistor 132 may include resistive material, such as, but not limited to tantalum nitride (TaN), nickel chromium (NiCr), or combinations thereof. For example, the resistor 132 may include tantalum nitride and the percentage of nitride in the resistor 132 may be adjusted (or tuned) to vary the resistance of the resistor 132. The thickness $T_{132}$ of the resistor 132 may range from about 0.04 um to about 0.08 um. A resistivity $\rho$ of the resistor 132 may range from about $1.32 \times 10^6$ μΩ/um to about $1.4 \times 10^9$ μΩ/um. In a non-limiting embodiment, the thickness $T_{132}$ of the resistor 132 may be about 0.06 um and the sheet resistance $Rs=\rho/T_{132}$ of the resistor 132 may range from about $7.92 \times 10^4$ μΩ/sqr to about $8.4 \times 10^7$ μΩ/sqr. The resistor 132 and the second electrode 128 may include a same material.

Referring to FIG. 1, the semiconductor device 100 may further include a via 134 within the further logic area 100c. The via 134 may electrically connect the first further logic contact 114 and the second further logic contact 122. In particular, the via 134 may extend from the first further logic contact 114 through the blocking layer 104 and the insulating layer 106 to adjoin the second further logic contact 122. The via 134 may include conductive material, such as, but not limited to, aluminum, copper, tungsten, alloys thereof or combinations thereof.

It is understood that the semiconductor device 100 may include fewer or more contacts than those depicted in FIG. 1. For example, instead of two second logic contacts 118, 120, the logic area 100b may include only a single second logic contact arranged at least partially within the insulating layer 106, and the resistor 132 may be arranged under and may adjoin this single second logic contact. Similarly, instead of a single second memory contact 116, the semiconductor device 100 may include a plurality of second memory contacts arranged at least partially within the insulating layer 106, and the second electrode 128 may be arranged under and may adjoin each of the plurality of second memory contacts. The first and second contacts 108, 110, 112, 114, 116, 118, 120, 122 may be referred to as interconnects.

FIGS. 2A to 2F show simplified cross-sectional views that illustrate a method for fabricating the semiconductor device 100 according to various non-limiting embodiments. For clarity of illustration, some reference numerals are omitted from FIGS. 2A to 2F.

Referring to FIG. 2A, the method may first include providing the base layer 102, and forming the first memory contact 108, the first logic contacts 110, 112 and the first further logic contact 114 at least partially within the base layer 102. For example, the base layer 102 may be provided by depositing insulating material over a surface on which the semiconductor device 100 is to be formed. The base layer 102 may then be etched to form a plurality of openings, and these openings may be filled with conductive material to form the first contacts 108, 110, 112, 114.

Referring to FIG. 2B, the method may further include forming the blocking layer 104 over the base layer 102 by for example, depositing blocking material over the base layer 102.

The insulating layer 106 may then be formed over the base layer 102. In particular, the insulating layer 106 may be formed in parts over the base layer 102 as illustrated in FIGS. 2C to 2F.

Referring to FIG. 2C, the method may include forming a first part 106a of the insulating layer 106 over the blocking layer 104. The first part 106a of the insulating layer 106, together with the blocking layer 104, may be etched to form an opening 202.

Referring to FIG. 2D, the method may include depositing electrode material into the opening 202 to form the first electrode 126. Memory material may then be deposited over the first part 106a of the insulating layer 106 and etched to form the intermediate element 130. The method may then include depositing protective material 204 over the first part 106a of the insulating layer 106 and the intermediate element 130.

Referring to FIG. 2E, a second part 106b of the insulating layer 106 may then be formed over the first part 106a of the insulating layer 106, in particular, over the protective material 204. The second part 106b of the insulating layer 106 may be etched to form a first opening 206 and a second opening 208. The etching process may continue until the intermediate element 130 is detected. Accordingly, a portion of the protective material 204 over the intermediate element 130 may be removed and the protective layer 150 may be formed. The formation of at least a portion of the first opening 206 may be simultaneous with the formation of at least a portion of the second opening 208. A third opening 210 through the first and second parts 106a, 106b of the insulating layer 106, the protective layer 150 and the blocking layer 104 may also be formed by etching through them.

Referring to FIG. 2F, the method may include depositing electrode material into the first opening 206 to form the second electrode 128 within the second part 106b of the insulating layer 106, and depositing resistive material into the second opening 208 to form the resistor 132 within the second part 106b of the insulating layer 106. The electrode material and the resistive material may include a same material, and the deposition of at least a portion of the electrode material may be simultaneous with the deposition of at least a portion of the resistive material. Conductive material may be deposited into the third opening 210 to form the via 134. A third part 106c of the insulating layer 106 may then be formed over the second part 106b of the insulating layer 106 and etched to form a plurality of openings. These openings may subsequently be filled with conductive material to form the second memory contact 116, second logic contacts 118, 120, and second further logic contact 122. The first, second and third parts 106a-106c may form the insulating layer 106.

The above described order for the method is only intended to be illustrative, and the method is not limited to the above specifically described order unless otherwise specifically stated.

Figure 3:
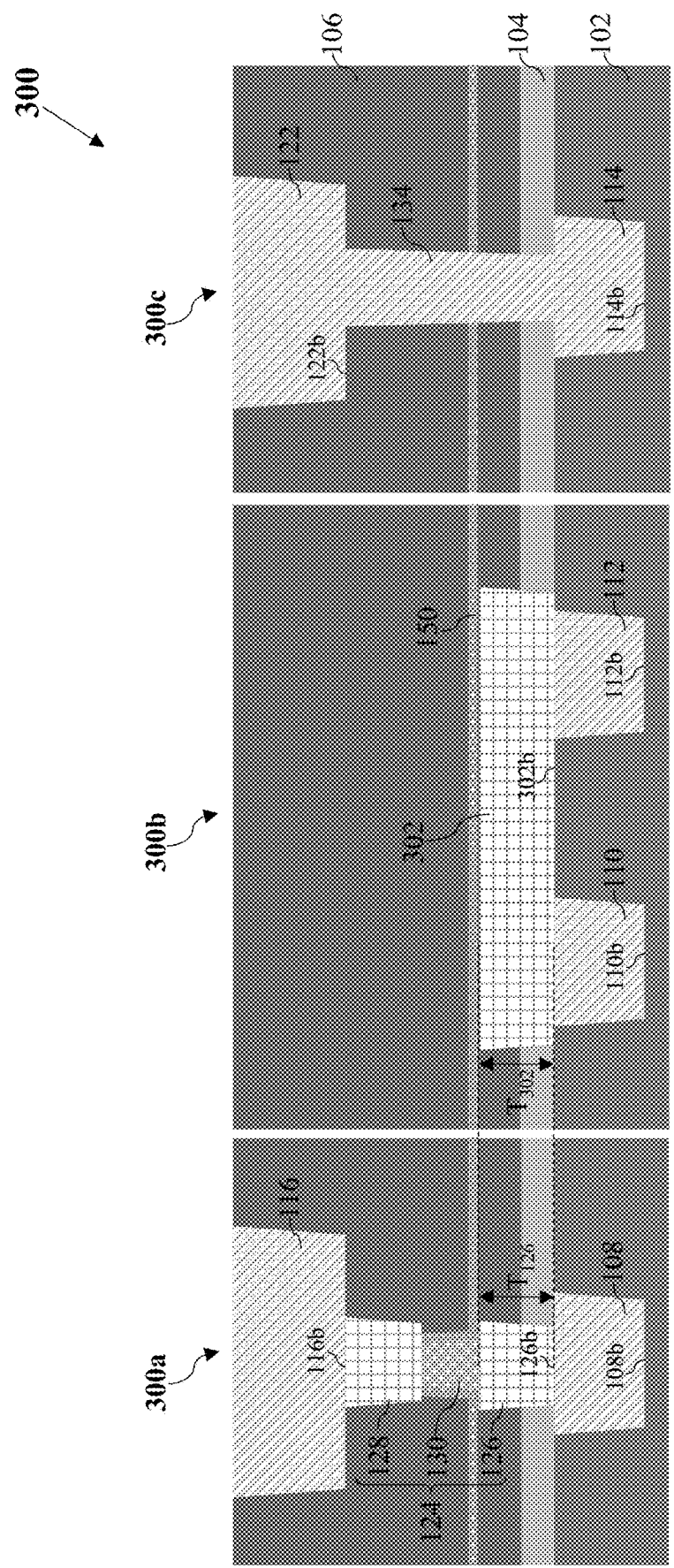
FIG. 3 shows a simplified cross-sectional view of a semiconductor device according to alternative non-limiting embodiments.

FIG. 3 shows a semiconductor device 300 according to alternative non-limiting embodiments. The device 300 is similar to the device 100, and thus, the common features are labelled with the same reference numerals and need not be discussed.

The semiconductor device 300 may also include a memory area 300a, a logic area 300b and a further logic area 300c, where a memory structure 124 may be arranged within the memory area 300a and a resistor 302 (similar to the resistor 132) may be arranged within the logic area 300b. However, in the semiconductor device 300, the resistor 302 may instead be arranged in substantially a same horizontal plane with the first electrode 126. In particular, a thickness $T_{302}$ of the resistor 302 may be approximately equal to a thickness $T_{126}$ of the first electrode 126, and the bottom surface 302b of the resistor 302 may be substantially horizontally aligned with the bottom surface 126b of the first electrode 126. Further, the resistor 302 and the first electrode 126 may include a same material. Also, the resistor 302 may be arranged over the first logic contacts 110, 112, and may adjoin these first logic contacts 110, 112. In addition, the protective layer 150 may be arranged over the resistor 302. As shown in FIG. 3, the second logic contacts 118, 120 may be absent in the semiconductor device 300. However, these second contacts 118, 112 may alternatively be provided in the semiconductor device 300.

FIGS. 4A to 4F show simplified cross-sectional views that illustrate a method for fabricating the semiconductor device 300 according to various non-limiting embodiments. For clarity of illustration, some reference numerals are omitted from FIGS. 4A to 4F.

Figure 4A:
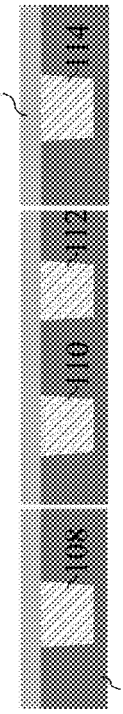
FIGS. 4A to 4F show simplified cross-sectional views that illustrate a method for fabricating the semiconductor device of FIG. 3 according to various non-limiting embodiments.
Figure 4C:
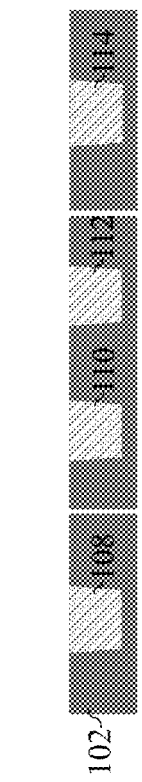
Figure 4E:
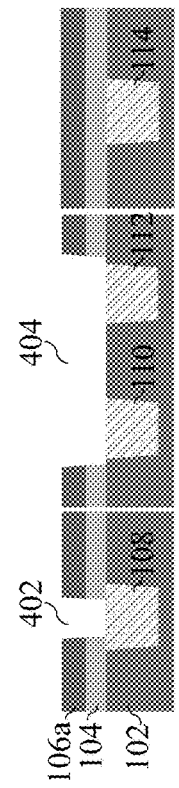
Figure 4B:
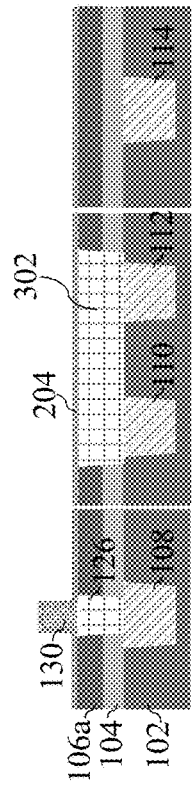

Referring to FIGS. 4A and 4B, the method may include providing the base layer 102, forming the first contacts 108, 110, 112, 114 and forming the blocking layer 104 over the base layer 102. This may be done in a manner similar to that described above with reference to FIGS. 2A and 2B.

Referring to FIG. 4C, the method may include forming a first part 106a of the insulating layer 106 over the blocking layer 104. The first part 106a of the insulating layer 106, together with the blocking layer 104, may be etched to form a first opening 402 and a second opening 404. The formation of at least a portion of the first opening 402 may be simultaneous with the formation of at least a portion of the second opening 404.

Figure 4D:
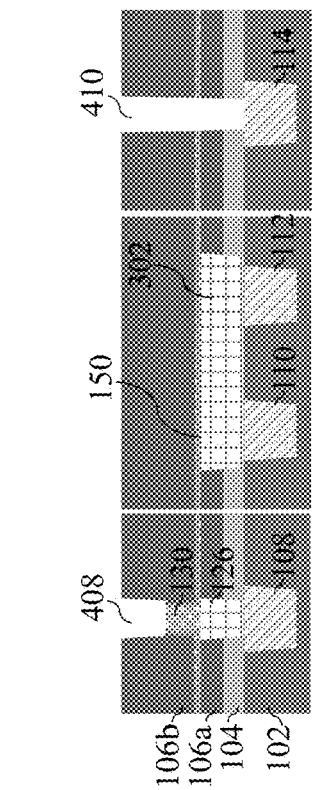

Referring to FIG. 4D, the method may include depositing electrode material into the first opening 402 to form the first electrode 126 within the first part 106a of the insulating layer 106, and depositing resistive material into the second opening 404 to form the resistor 302 within the first part 106a of the insulating layer 106. The electrode material and the resistive material may include a same material, and the deposition of at least a portion of the electrode material may be simultaneous with the deposition of at least a portion of the resistive material. Memory material may then be deposited over the first part 106a of the insulating layer 106 and etched to form the intermediate element 130. The method may then include depositing protective material 204 over the first part 106a of the insulating layer 106 and the intermediate element 130.

Referring to FIG. 4E, a second part 106b of the insulating layer 106 may then be formed over the first part 106a of the insulating layer 106 (in particular, over the protective material 204), and etched to form an opening 408. This etching may remove a portion of the protective material 204 over the intermediate element 130, thus forming the protective layer 150. In addition, a further opening 410 may be formed through the first and second parts 106a-106b of the insulating layer 106, the protective layer 150 and the blocking layer 104 by etching through them.

Figure 4F:
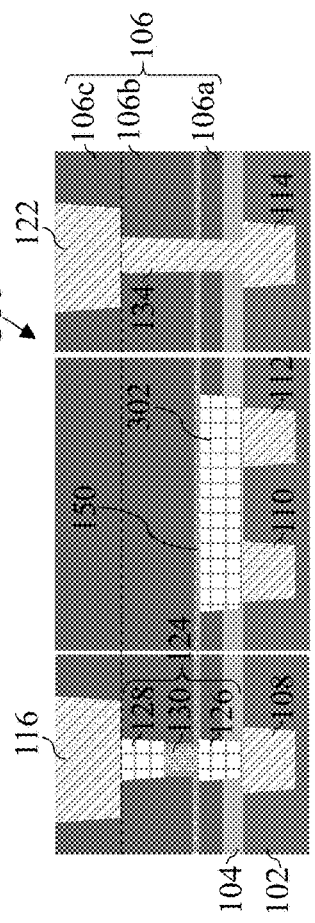

Referring to FIG. 4F, the method may include depositing electrode material into the opening 408 to form the second electrode 128 and depositing conductive material into the further opening 410 to form the via 134. A third part 106c of the insulating layer 106 may be formed over the second part 106b of the insulating layer 106. This third part 106c of the insulating layer 106 may be etched to form a plurality of openings that may subsequently be filled with conductive material to form the second contacts 116, 122. The first, second, and third parts 106a-106c may form the insulating layer 106.

The above described order for the method is only intended to be illustrative, and the method is not limited to the above specifically described order unless otherwise specifically stated.

Figure 5:
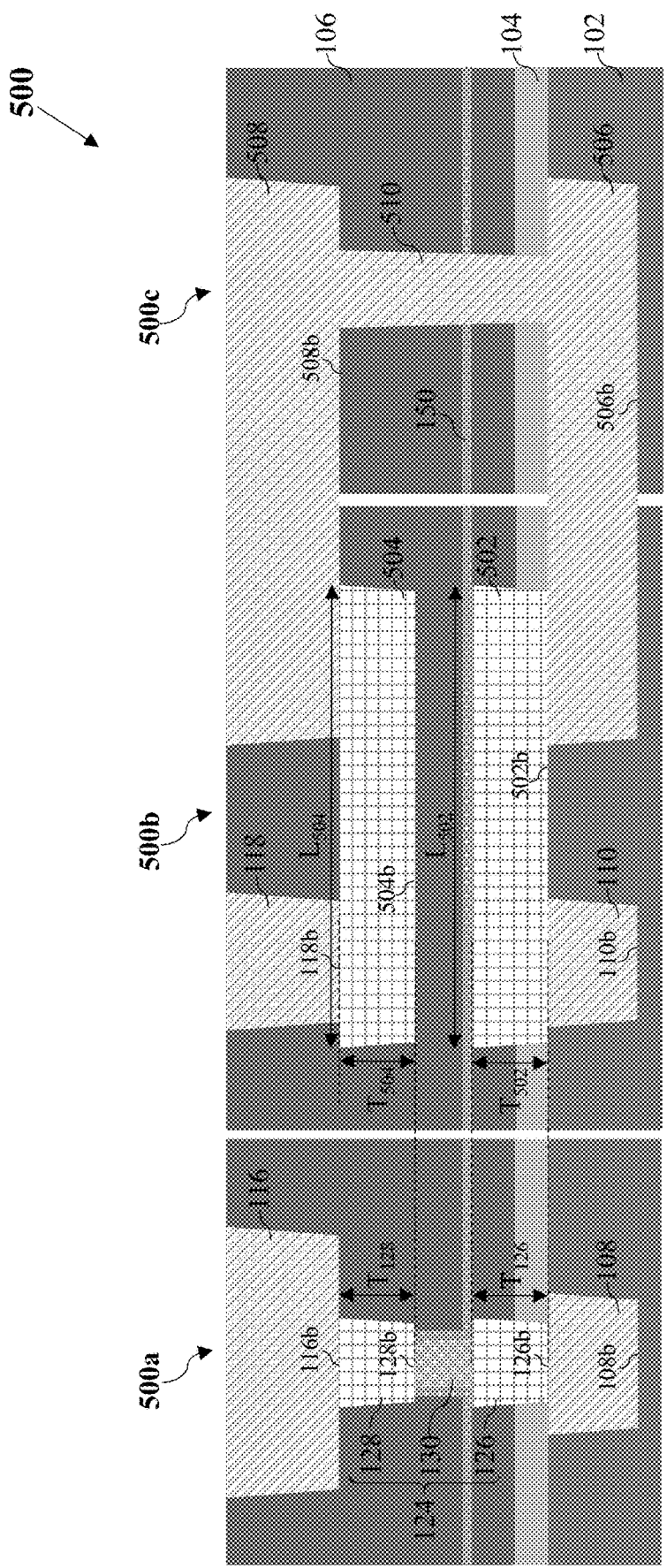
FIG. 5 shows a simplified cross-sectional view of a semiconductor device according to alternative non-limiting embodiments.

FIG. 5 shows a semiconductor device 500 according to alternative non-limiting embodiments. The device 500 is similar to the device 100, and thus, the common features are labelled with the same reference numerals and need not be discussed.

As shown in FIG. 5, the semiconductor device 500 may also include a memory area 500a, a logic area 500b and a further logic area 500c. However, instead of a single resistor 132, the semiconductor device 500 may include a first resistor 502 and a second resistor 504 arranged within the logic area 500b. These resistors 502, 504 may be similar to the resistor 132 of the device 100, and may be thin film resistors. Referring to FIG. 5, the first resistor 502 and the second resistor 504 may be arranged at least partially within the insulating layer 106, with the second resistor 504 arranged above the first resistor 502. The first resistor 502 and the second resistor 504 may be vertically spaced apart from each other, such that a part of the insulating layer 106 may be arranged between the first resistor 502 and the second resistor 504, and the protective layer 150 may be arranged over the first resistor 502. Further, the first resistor 502 and the second resistor 504 may be planar and may extend substantially parallel to each other. In addition, as shown in FIG. 5, a length $L_{502}$ of the first resistor 502 may be approximately equal to a length $L_{504}$ of the second resistor 504. By "length", it is meant a longest lateral distance between one side surface and an opposite side surface of the resistor 502/504. Also, the first resistor 502 and the second resistor 504 may be arranged in substantially a same vertical plane.

The semiconductor device 500 may also include a plurality of first contacts 108, 110, 506 arranged at least partially within the base layer 102 and a plurality of second contacts 116, 118, 508 arranged at least partially within the insulating layer 106. However, instead of four first contacts 108, 110, 112, 114, the semiconductor device 500 may include only three first contacts 108, 110, 506 (including a first memory contact 108 within the memory area 500a, a first logic contact 110 within the logic area 500b and an extended first contact 506 extending between the logic area 500b and the further logic area 500c). Similarly, instead of four second contacts 116, 118, 120, 122, the semiconductor device 500 may include only three second contacts 116, 118, 508 (including a second memory contact 116 within the memory area 500a, a second logic contact 118 within the logic area 500b and an extended second contact 508 extending between the logic area 500b and the further logic area 500c). The first contacts 108, 110, 506 may be arranged in substantially a same horizontal plane and the second contacts 116, 118, 508 may be arranged in substantially a same horizontal plane. In particular, the first contacts 108, 110, 506 may have a same thickness, with their bottom surfaces 108b, 110b, 506b substantially horizontally aligned. Similarly, the second contacts 116, 118, 508 may have a same thickness, with their bottom surfaces 116b, 118b, 508b substantially horizontally aligned. The semiconductor device 500 may further include a via 510 extending between the first extended contact 506 and the second extended contact 508 to electrically connect these extended contacts 506, 508. As shown in FIG. 5, the via 510 may extend through the insulating layer 106 and the blocking layer 104 within the further logic area 500c.

Referring to FIG. 5, the first resistor 502 may be arranged in substantially a same horizontal plane with the first electrode 126 and the second resistor 504 may be arranged in substantially a same horizontal plane with the second electrode 128. In particular, a thickness $T_{502}$ of the first resistor 502 may be approximately equal to a thickness $T_{126}$ of the first electrode 126; whereas, a thickness $T_{504}$ of the second resistor 504 may be approximately equal to a thickness $T_{128}$ of the second electrode 128. Further, a bottom surface 502b of the first resistor 502 may be substantially horizontally aligned with a bottom surface 126b of the first electrode 126; whereas, a bottom surface 504b of the second resistor 504 may be substantially horizontally aligned with a bottom surface 128b of the second electrode 128. The first resistor 502 may include a same material as the first electrode 126, and the second resistor 504 may include a same material as the second electrode 128. Further, the first resistor 502 may be arranged over the first logic contact 110 and the first extended contact 506, and may adjoin both the first logic contact 110 and the first extended contact 506. The second resistor 504 may be arranged under the second logic contact 118 and the second extended contact 508, and may adjoin both the second logic contact 118 and the second extended contact 508.

FIGS. 6A to 6F show simplified cross-sectional views that illustrate a method for fabricating the semiconductor device 500 according to various non-limiting embodiments. For clarity of illustration, some reference numerals are omitted from FIGS. 6A to 6F.

Referring to FIG. 6A, the method may include providing the base layer 102 and forming the first memory contact 108, the first logic contact 110 and the first extended contact 506 at least partially within the base layer 102. In particular, the base layer 102 may be provided by depositing insulating material over a surface on which the semiconductor device 500 is to be formed. The base layer 102 may then be etched to form openings and the openings may be filled with conductive material to form the first contacts 108, 110, 506.

Referring to FIGS. 6B to 6D, the method may include forming the blocking layer 104, the first part 106a of the insulating layer 106, the first electrode 126, the intermediate element 130 and the protective material 204 in a manner similar to that described above with reference to FIGS. 4B to 4D. The first resistor 502 may also be formed in a manner similar to that for forming the resistor 302 as described above with reference to FIG. 4D.

Referring to FIG. 6E, a second part 106b of the insulating layer 106 may then be formed over the first part 106a of the insulating layer 106, in particular, over the protective material 204. Thereafter, the second part 106b of the insulating layer 106 may be etched to form a first opening 602 and a second opening 604. The etching process may continue until the intermediate element 130 is detected, and accordingly, a portion of the protective material 204 over the intermediate element 130 may be removed and the protective layer 150 may be formed. The formation of at least a portion of the first opening 602 may be simultaneous with the formation of at least a portion of the second opening 604. A third opening 606 may also be formed through the first and second parts 106*a*, 106*b* of the insulating layer 106, the protective layer 150 and the blocking layer 104 by etching through them.

Referring to FIG. 6F, the method may include depositing electrode material into the first opening 602 to form the second electrode 128 within the second part 106*b* of the insulating layer 106, and depositing resistive material into the second opening 604 to form the second resistor 504 within the second part 106*b* of the insulating layer 106. The electrode material and the resistive material may include a same material, and the deposition of at least a portion of the electrode material may be simultaneous with the deposition of at least a portion of the resistive material. The method may further include depositing conductive material into the third opening 606 to form the via 510. In addition, the method may include forming a third part 106*c* of the insulating layer 106 over the second part 106*b* of the insulating layer 106, and etching the third part 106*c* of the insulating layer 106 to form a plurality of openings. These openings may then be filled with conductive material to form the second memory contact 116, the second logic contact 118 and the second extended contact 508. The first, second and third parts 106*a*-106*c* may form the insulating layer 106.

The above described order for the method is only intended to be illustrative, and the method is not limited to the above specifically described order unless otherwise specifically stated.

Figure 7:
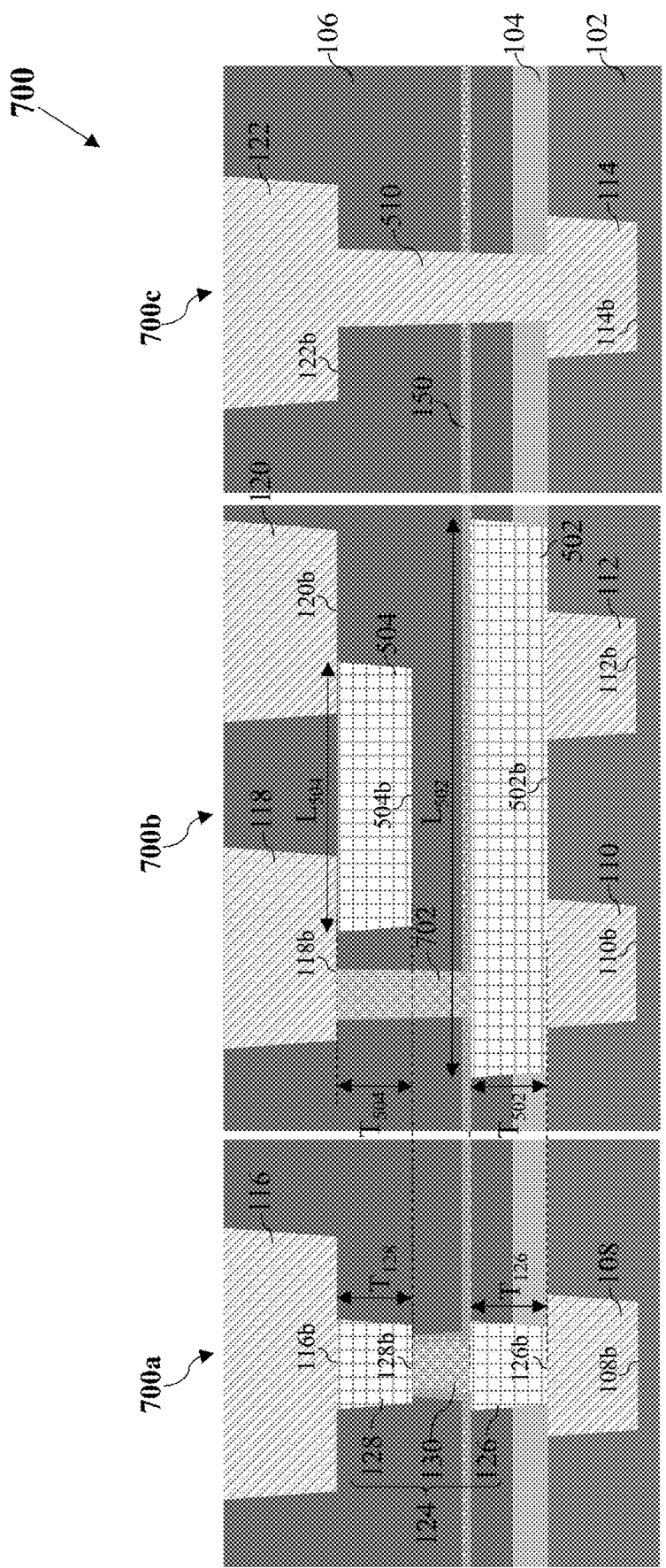
FIG. 7 shows a simplified cross-sectional view of a semiconductor device according to alternative non-limiting embodiments.

FIG. 7 shows a semiconductor device 700 according to alternative non-limiting embodiments. The device 700 is similar to the device 500, and thus, the common features are labelled with the same reference numerals and need not be discussed.

As shown in FIG. 7, the semiconductor device 700 may also include a memory area 700*a*, a logic area 700*b* and a further logic area 700*c*, where a memory structure 124 may be arranged within the memory area 700*a*, and first and second resistors 502, 504 may be arranged within the logic area 700*b*. However, a length $L_{502}$ of the first resistor 502 may be different from a length $L_{504}$ of the second resistor 504. In particular, the length $L_{504}$ of the second resistor 504 may be less than the length $L_{502}$ of the first resistor 502. The second resistor 504 may be arranged relative to the first resistor 502, such that it may at least overlap with a middle portion of the first resistor 502 as shown in FIG. 7.

The semiconductor device 700 may include first and second contacts 108, 110, 112, 114, 116, 118, 120, 122 similar to those of the semiconductor devices 100, 300. In particular, the semiconductor device 700 may include four first contacts (including a first memory contact 108, a first logic contact 110, an additional first logic contact 112 and a first further logic contact 114) arranged at least partially within the base layer 102. Further, the semiconductor device 700 may also include four second contacts (including a second memory contact 116, a second logic contact 118, an additional second logic contact 120 and a second further logic contact 122) arranged at least partially within the insulating layer 106. The semiconductor device 700 may additionally include a via 702 arranged at least partially within the insulating layer 106 and within the logic area 700*b*. The via 702 may extend between the second logic contact 118 and the first resistor 502 (through the insulating layer 106 and the protective layer 150) to electrically connect them. Further, the second resistor 504 may extend between and under the second logic contact 118 and the additional second logic contact 120, and may adjoin both these second logic contacts 118, 120.

FIGS. 8A to 8F show simplified cross-sectional views that illustrate a method for fabricating the semiconductor device 700 according to various non-limiting embodiments. For clarity of illustration, some reference numerals are omitted from FIGS. 8A to 8F.

Referring to FIG. 8A, the method may include providing the base layer 102 and forming the first contacts 108, 110, 112, 114 in a manner similar to that described above with reference to FIG. 2A.

Referring to FIGS. 8B to 8D, the method may include forming the blocking layer 104, the first part 106*a* of the insulating layer 106, the first electrode 126, the first resistor 502, the intermediate element 130 and the protective material 204 in a manner similar to that described above with reference to FIGS. 6B to 6D.

Referring to FIG. 8E, a second part 106*b* of the insulating layer 106 may then be formed over the first part 106*a* of the insulating layer 106, in particular, over the protective material 204. Thereafter, the second part 106*b* of the insulating layer 106 may be etched to form a first opening 802 and a second opening 804. The etching process may continue until the intermediate element 130 is detected, and accordingly, a portion of the protective material 204 over the intermediate element 130 may be removed and the protective layer 150 may be formed. The formation of at least a portion of the first opening 802 may be simultaneous with the formation of at least a portion of the second opening 804. A third opening 806 may be formed through the second part 106*b* of the insulating layer 106 and the protective layer 150 by etching through them until the first resistor 502 is detected, and a fourth opening 808 may be formed through the first and second parts 106*a*, 106*b* of the insulating layer 106, the protective layer 150 and the blocking layer 104 by etching through them.

Referring to FIG. 8F, the method may further include depositing electrode material into the first opening 802 to form the second electrode 128 within the second part 106*b* of the insulating layer 106, and depositing resistive material into the second opening 804 to form the second resistor 504 within the second part 106*b* of the insulating layer 106. The electrode material and the resistive material may include a same material, and the deposition of at least a portion of the electrode material may be simultaneous with the deposition of at least a portion of the resistive material. The method may further include depositing conductive material into the third and fourth openings 806, 808 to form the vias 702, 510 respectively. Thereafter, the method may include forming a third part 106*c* of the insulating layer 106 over the second part 106*b* of the insulating layer 106, and etching the third part 106*c* of the insulating layer 106 to form a plurality of openings. These openings may then be filled with conductive material to form the second memory contact 116, the second logic contacts 118, 120 and the second further logic contact 122. The first, second and third parts 106*a*-106*c* may form the insulating layer 106.

The above described order for the method is only intended to be illustrative, and the method is not limited to the above specifically described order unless otherwise specifically stated.

As described above, each semiconductor device 100, 300, 500, 700 may include an embedded memory (memory structure 124) and at least one resistor (resistor 132, resistor 302 or first and second resistors 502, 504). In other words, the embedded memory and the at least one resistor may be integrated within a same chip. Each semiconductor device 100, 300, 500, 700 may be used for multiple functions, such as, but not limited to, a dummy. As described above, at least a portion of each resistor 132/302/502/504 may be formed together with at least a portion of one of the first and second electrodes 126, 128. This can help reduce the number of masks required for fabricating the semiconductor device 100, 300, 500, 700, hence simplifying the fabrication process of the device 100, 300, 500, 700, in turn, reducing manufacturing costs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A semiconductor device comprising:
   a base layer;
   an insulating layer arranged over the base layer;
   a memory structure arranged at least partially within the insulating layer, wherein the memory structure comprises a first electrode, a second electrode, and an intermediate element between the first electrode and the second electrode; and
   a first resistor arranged at least partially within the insulating layer, wherein the first resistor is arranged in substantially a same horizontal plane with the first electrode,
   a second resistor arranged at least partially within the insulating layer and above the first resistor, wherein a part of the insulating layer is arranged between the first resistor and the second resistor;
   a first contact arranged at least partially within the base layer;
   a second contact arranged at least partially within the insulating layer; and
   a via extending between the first contact and the second contact;
   wherein the first resistor is arranged over and adjoins the first contact and wherein the second resistor is arranged under and adjoins the second contact.

2. The semiconductor device of claim 1, wherein the second resistor is arranged in substantially the same horizontal plane with the second electrode; and wherein the semiconductor device further comprises a contact arranged at least partially within the insulating layer, and wherein the second resistor is arranged under and adjoins the contact.

3. The semiconductor device of claim 1, wherein the semiconductor device further comprises a contact arranged at least partially within the base layer, and wherein the first resistor is arranged over and adjoins the contact.

4. The semiconductor device of claim 1, wherein a thickness of the first resistor is approximately equal to a thickness of the first electrode, and a thickness of the second resistor is approximately equal to a thickness of the second electrode.

5. The semiconductor device of claim 1, wherein a length of the first resistor is approximately equal to a length of the second resistor.

6. The semiconductor device of claim 5, wherein the first resistor and the second resistor are arranged in substantially a same vertical plane.

7. The semiconductor device of claim 1, wherein a length of the first resistor is different from a length of the second resistor.

8. The semiconductor device of claim 7, wherein the length of the second resistor is less than the length of the first resistor.

9. The semiconductor device of claim 8, wherein the second resistor at least overlaps with a middle portion of the first resistor.

10. The semiconductor device of claim 1, wherein the via directly electrically connects the second contact and the first resistor.

11. The semiconductor device of claim 10, further comprising an additional first contact arranged at least partially within the base layer, an additional second contact arranged at least partially within the insulating layer, and an additional via, wherein the additional via extends between the additional first contact and the additional second contact.

12. The semiconductor device of claim 1, wherein the first resistor or the second resistor is planar.

13. The semiconductor device of claim 1, wherein the first resistor and the second resistor are planar and extend parallel to each other.

14. The semiconductor device of claim 1, wherein the via directly connects the first and second contacts.

15. A method for fabricating a semiconductor device, the method comprising:
    providing a base layer;
    forming a first contact arranged at least partially within the base layer;
    forming an insulating layer over the base layer;
    forming a memory structure at least partially within the insulating layer, wherein the memory structure comprises a first electrode, a second electrode and an intermediate element between the first electrode and the second electrode;
    forming a first resistor at least partially within the insulating layer, wherein the first resistor is arranged in substantially a same horizontal plane with the first electrode;
    forming a second resistor at least partially within the insulating layer and above the first resistor, wherein a part of the insulating layer is arranged between the first resistor and the second resistor;
    forming a second contact arranged at least partially within the insulating layer; and
    forming a via extending between the first contact and the second contact, wherein the first resistor is arranged over and adjoins the first contact and wherein the second resistor is arranged under and adjoins the second contact.

16. The method of claim 15, wherein forming the insulating layer over the base layer comprises forming the insulating layer in parts over the base layer, and forming the first resistor and the first electrode arranged in substantially the same horizontal plane as the resistor comprises:
    etching a part of the insulating layer to form a first opening and a second opening;
    depositing electrode material into the first opening to form the first electrode within the part of the insulating layer; and
    depositing resistive material into the second opening to form the first resistor within the part of the insulating layer.

17. The method of claim 16, wherein the electrode material and the resistive material comprise a same material, and wherein the deposition of at least a portion of the electrode material is simultaneous with the deposition of at least a portion of the resistive material.

18. The method of claim 15, wherein forming the via comprises forming the via to directly electrically connect the first resistor and the second contact.

\* \* \* \* \*